(12) United States Patent
Kim

(10) Patent No.: US 9,601,449 B2
(45) Date of Patent: Mar. 21, 2017

(54) THIN LAYER DEPOSITION APPARATUS UTILIZING A MASK UNIT IN THE MANUFACTURE OF A DISPLAY DEVICE

(71) Applicant: Samsung Display Co., Ltd., Yongin, Gyeonggi-Do (KR)

(72) Inventor: Jong Yun Kim, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 198 days.

(21) Appl. No.: 13/966,499

(22) Filed: Aug. 14, 2013

(65) Prior Publication Data

US 2014/0203247 A1 Jul. 24, 2014

(30) Foreign Application Priority Data

Jan. 23, 2013 (KR) .................. 10-2013-0007626

(51) Int. Cl.
| | | |
|---|---|---|
| H01L 27/32 | (2006.01) |
| C23C 14/42 | (2006.01) |
| H01L 23/00 | (2006.01) |
| H01L 51/00 | (2006.01) |
| C23C 14/04 | (2006.01) |
| H01L 51/56 | (2006.01) |

(52) U.S. Cl.
CPC ............ H01L 24/11 (2013.01); C23C 14/042 (2013.01); H01L 27/3276 (2013.01); H01L 51/0023 (2013.01); *H01L 51/56* (2013.01); *H01L 2924/12041* (2013.01); *H01L 2924/12042* (2013.01); *H01L 2924/12044* (2013.01)

(58) Field of Classification Search
CPC ............................. H01L 27/32; C23C 14/042
USPC ............................................ 257/40; 118/504
See application file for complete search history.

(56) References Cited

U.S. PATENT DOCUMENTS

| | | | | |
|---|---|---|---|---|
| 4,678,447 A | * | 7/1987 | Prazak, III | ............ H01J 9/263 430/23 |
| 5,977,633 A | * | 11/1999 | Suzuki et al. | ................ 257/738 |
| 2001/0045668 A1 | * | 11/2001 | Liou et al. | ..................... 257/778 |
| 2007/0124898 A1 | * | 6/2007 | Clark | ................. A44C 17/0216 24/303 |
| 2010/0270364 A1 | * | 10/2010 | Sakaguchi et al. | ........... 228/246 |
| 2011/0006421 A1 | * | 1/2011 | Daubenspeck | ....... H01L 23/488 257/737 |
| 2012/0043653 A1 | * | 2/2012 | Oh | ....................... H05K 3/4015 257/735 |
| 2013/0341598 A1 | * | 12/2013 | Chang et al. | ................... 257/40 |

FOREIGN PATENT DOCUMENTS

| | | |
|---|---|---|
| KR | 10-2003-0071651 A | 9/2003 |
| KR | 10-0542997 B1 | 1/2006 |
| KR | 10-2010-0137785 A | 12/2010 |
| KR | 10-2011-0128579 A | 11/2011 |
| KR | 1020100048098 | * 11/2011 |

* cited by examiner

*Primary Examiner* — Allen Parker
*Assistant Examiner* — Ismail Muse
(74) *Attorney, Agent, or Firm* — Robert E. Bushnell, Esq.

(57) ABSTRACT

A mask unit for depositing a thin layer in a display device. The mask unit includes: a bead mask support which includes a plate; and a bead mask which is placed on the bead mask support.

11 Claims, 11 Drawing Sheets

US 9,601,449 B2

THIN LAYER DEPOSITION APPARATUS UTILIZING A MASK UNIT IN THE MANUFACTURE OF A DISPLAY DEVICE

CLAIM PRIORITY

This application makes reference to, incorporates the same herein, and claims all benefits accruing under 35 U.S.C. §119 from an application earlier filed in the Korean Intellectual Property Office on 23 Jan. 2013 and there duly assigned Serial No. 10-2013-0007626.

BACKGROUND OF THE INVENTION

1. Field of the Invention

The present invention relates to a thin layer deposition apparatus for a display device, a mask unit for depositing a thin layer in a display device, a display device and a method of manufacturing the display device.

2. Description of the Related Art

Recently, the technological development of display devices has become important. In particular, organic light-emitting diode (OLED) displays are drawing attention as natural color display devices.

The above information disclosed in this Related Art section is only for enhancement of understanding of the background of the invention and therefore it may contain information that does not form the prior art that is already known to a person of ordinary skill in the art.

SUMMARY OF THE INVENTION

Aspects of the present invention provide a mask unit for depositing a thin layer in a display device and a thin layer deposition apparatus for a display device, the mask unit and the thin layer deposition apparatus being employed to simplify a process of manufacturing a display device by omitting a process of etching an organic layer using a laser.

Aspects of the present invention also provide a method of manufacturing a display device at reduced costs with improved process efficiency.

Aspects of the present invention also provide a display device which can provide high image quality without increasing power consumption by minimizing a voltage drop.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there may be provided a mask unit for depositing a thin layer in a display device. The mask unit includes: a bead mask support which includes a plate; and a bead mask which may be placed on the bead mask support.

According to another aspect of the present invention, there is provided a thin layer deposition apparatus for a display device. The thin layer deposition apparatus includes: a substrate support which supports a display substrate; a mask unit which may be placed on a side of the substrate support and includes a bead mask for masking a contact hole in the display substrate; a magnetic force applying unit which may be placed on the other side of the substrate support and selectively applies a magnetic force to the bead mask; and a source unit which may be disposed on a side of the mask unit and provides a deposition material to the display substrate.

According to another aspect of the present invention, there is provided a method of manufacturing a display device. The method includes: preparing a display substrate which includes a contact hole formed in a surface thereof and a contact formed in the contact hole; inserting a bead mask into the contact hole; forming an organic layer on the display substrate; and separating the bead mask from the display substrate.

According to another aspect of the present invention, there is provided a display device including: a first electrode which may be formed on a substrate and a contact hole which may be formed in the substrate; a pixel defining layer which partially exposes the first electrode; a contact electrode which may be formed in the contact hole; a light-emitting layer which may be formed on the first electrode; an organic layer which may be formed on the light-emitting layer and the pixel defining layer; and a second electrode which may be formed on the organic layer and in the contact hole and may be electrically connected to the contact electrode, wherein a thickness or surface roughness of a region of the contact electrode which contacts the second electrode may be uniform.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
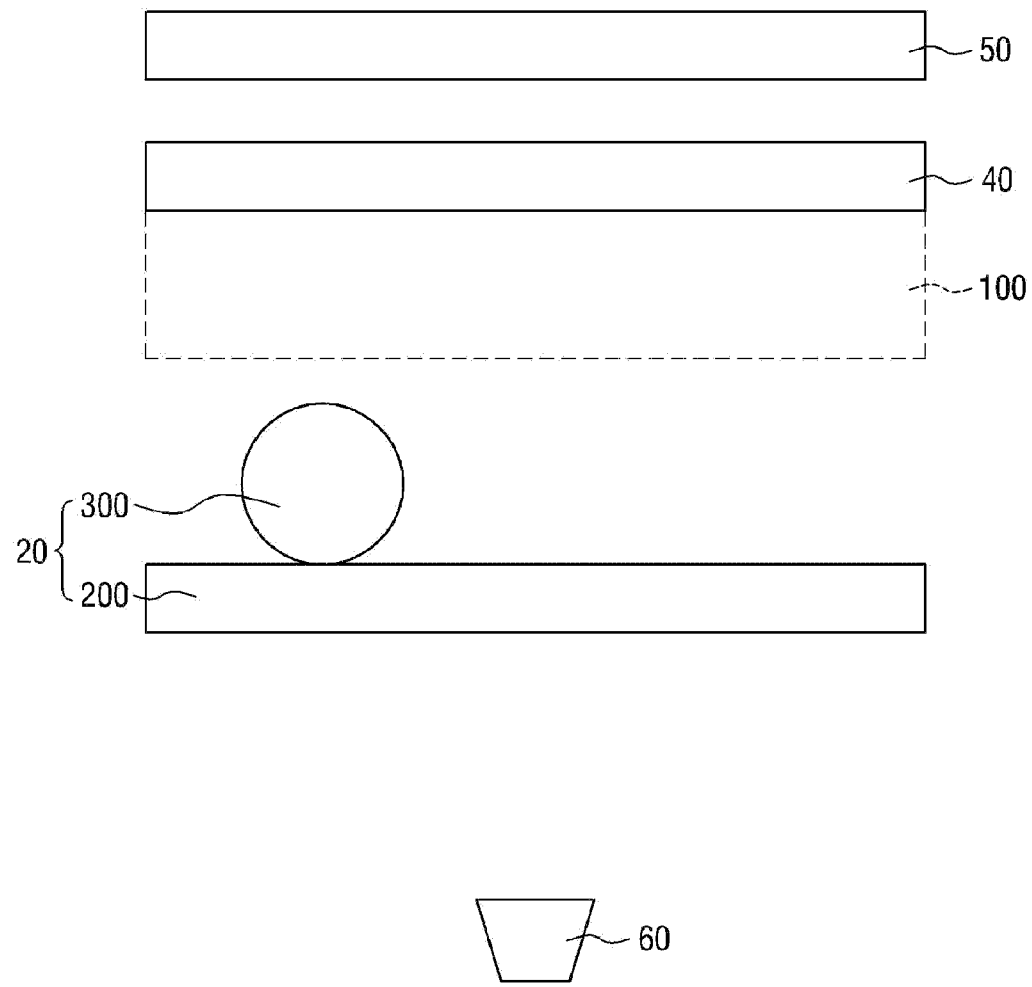
FIG. 1 is a view illustrating the schematic configuration of a thin layer deposition apparatus for a display device according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An OLED display is a display device with self-luminous characteristics. An OLED display includes a cathode, an anode, and an organic light-emitting layer formed between the cathode and the anode. OLED displays configured as described above are classified into top emission OLED displays and bottom emission OLED displays according to the direction in which light may be emitted from the organic light-emitting layer. The top emission OLED displays have a higher aperture ratio than the bottom emission OLED displays.

In a top emission OLED display, a cathode disposed in the direction of light emission should be formed thinly of a transparent electrode material such as ITO, IZO, etc. However, since the transparent electrode material has high resistivity, if the cathode is formed over all pixel regions in the form of a common electrode, a voltage may vary according to location, resulting in non-uniform image quality. That is, a voltage difference (voltage drop) between a location close to a power source and a location far away from the power source may cause a luminance difference between pixels, thus reducing image quality. This voltage difference increases as the size of the OLED display operated by a current driving method increases.

To overcome the above problem, a method of preventing a voltage drop by forming an auxiliary electrode outside each pixel and connecting the auxiliary electrode to a cathode has been suggested. In this method, after an organic light-emitting layer may be deposited on the whole surface of a substrate as a common layer, it may be required to etch the common layer on the auxiliary electrode using a laser in order for electrical connection between the auxiliary electrode and the cathode. However, the use of the laser may damage the common layer formed of an organic material, create particles, and require expensive equipment.

The present invention will now be described more fully with reference to the accompanying drawings, in which embodiments of the invention are shown.

FIG. 1 is a view illustrating the schematic configuration of a thin layer deposition apparatus 1 for a display device according to an embodiment of the present invention.

Referring to FIG. 1, the thin layer deposition apparatus 1 according to the current embodiment may include a substrate support 40, a mask unit 20, a magnetic force applying unit 50, and a source unit 60.

The substrate support 40 supports and fixes a display substrate 100 on which a deposition material may be deposited. The mask unit 20 may be placed on a side of the substrate support 40 and includes a bead mask 300. The magnetic force applying unit 50 may be placed on the other side of the substrate support 40 and selectively applies a magnetic force to the bead mask 300. The source unit 60 provides a deposition material to the display substrate 100.

The display substrate 100 may include a substrate and a contact hole formed in the substrate, and a contact electrode may be formed in the contact hole. The substrate may include an insulating substrate. The insulating substrate may be formed of a transparent glass material containing transparent $SiO_2$ as its main component. In some embodiments, the insulating substrate may be formed of an opaque material or a plastic material. Further, the insulating substrate may be a flexible substrate. Although not shown in the drawing, the substrate may further include other structures formed on the insulating substrate. Examples of other structures may include, but are not limited to, wiring lines, electrodes, insulating layers, etc.

The mask unit 20 may include the bead mask 300 and a bead mask support 200.

The bead mask support 200 fixes and supports the bead mask 300. The bead mask support 200 may include a plate which forms the body of the bead mask support 200 and may further include a protrusion which may be formed on the plate and on which the bead mask 300 may be mounted.

The bead mask support 200 may include an electromagnet and adjust the intensity of a magnetic force by controlling the amount of current supplied to the electromagnet. For example, in a case where the bead mask support 200 supports the bead mask 300, a current may be supplied to the bead mask support 200, thus generating a magnetic force. The magnetic force may generate an attractive force between the bead mask 300 and the bead mask support 200. Accordingly, the bead mask 300 can be mounted more firmly on the bead mask support 200. In a case where the bead mask 300 is separated from the bead mask support 200 to be mounted on the display substrate 100, the magnetic force generated by the bead mask support 200 may be reduced or removed. Accordingly, the bead mask 300 can be separated from the bead mask support 200 more easily. However, this is merely an example, and the bead mask support 200 may also be formed of a magnetic metal material.

The bead mask 300 may be inserted into, e.g., the contact hole of the display substrate 100 and prevent the deposition of a deposition material in the contact hole in a thin layer deposition process.

The bead mask 300 may have a circular cross-section as shown in FIG. 1. However, the cross-sectional shape of the bead mask 300 is not limited to the circular shape, and the bead mask 300 can have various cross-sectional shapes including a polygonal shape (e.g., a pentagon, a hexagon, etc.) and an oval shape.

The size of the bead mask 300 may be adjusted appropriately according to the size of the contact hole (which is to be masked) in the display substrate 100. In FIG. 1, one bead mask 300 may be placed on the bead mask support 200. However, this is merely an example, and the number of bead masks placed on the bead mask support 200 may vary according to the number of contact holes to be masked.

The bead mask 300 may include a magnetic substance. The magnetic substance is a substance that is magnetized by a magnet. The magnetic substance may be, but is not limited to, a ferromagnetic substance or a paramagnetic substance.

The bead mask 300 may also be formed of a permanent magnet. That is, the bead mask 300 may be formed of a permanent magnet having polarities of N and S poles. The material that forms the permanent magnet is not limited and may be, but is not limited to, a neodymium magnet, a ferrite magnet, an alnico magnet or a samarium cobalt magnet.

The substrate support 40 supports the display substrate 100 placed on a surface thereof. The substrate support 40 may include a substrate fixing unit (not shown). The substrate fixing unit fixes the display substrate 100 in position on the surface of the substrate support 40. Thus, the substrate fixing unit can prevent the shaking or movement of the display substrate 100 during the thin layer deposition process. The substrate fixing unit may be, but is not limited to, a vacuum chuck or a clamp.

The substrate support 40 may include a cooling unit. The cooling unit increases efficiency of thin layer deposition by lowering the temperature of the display substrate 100 before the thin layer deposition process. The cooling unit may be integrally formed with the substrate support 40. In an example, the substrate support 40 itself may be formed of a cooling plate to function as the cooling unit. Alternatively, the cooling unit may be implemented by forming a line, into which cooling water or cooling air may be injected, inside the substrate support 40. However, these are merely examples, and the cooling unit can be formed in the substrate support 40 in various ways using all technologies that have been developed and commercialized or are realizable depending on future technological developments.

The magnetic force applying unit 50 selectively applies a magnetic force to the bead mask 300. In an example, when the bead mask 300 may be mounted on the display substrate 100, the magnetic force applying unit 50 may apply an attractive force to the bead mask 300 so that the bead mask 300 can be inserted more easily into the contact hole of the display substrate 100.

The magnetic force application unit 50 may include an electromagnet and adjust the intensity of a magnetic force by controlling the amount of current supplied to the electromagnet. That is, the magnetic force applying unit 50 may selectively apply an attractive force to the bead mask 300 by generating a magnetic force and remove the attractive force applied to the bead mask 300 by reducing or removing the magnetic force. In an example, when the bead mask 300 may be mounted on the display substrate 100, the magnetic force applying unit 50 applies a magnetic force to the bead mask 300, thus generating an attractive force between the magnetic force applying unit 50 and the bead mask 300. Accordingly, the bead mask 300 can be mounted more easily on the display substrate 100. During the thin layer deposition process, the magnetic force applying unit 50 prevents the separation of the bead mask 300 from the display substrate 100 and the occurrence of deposition defects by attaching the bead mask 300 more securely to the display substrate 300. After the thin layer deposition process, the magnetic force applied to the bead mask 300 may be reduced or removed by reducing or removing the amount of current supplied to the magnetic force applying unit 50. Accordingly, the bead mask 300 can be separated more easily from the display substrate 100. However, the above description is merely an example, and the scope of the present invention is not limited to this example.

The source unit 60 provides a deposition material to the display substrate 100 and can have any form. In an example, the source unit 60 may include a heating container which stores the deposition material and has an aperture formed in the direction of the display substrate 100 and a heating unit which applies heat to the heading container. However, this is merely an example, and the source unit 60 can be implemented in all forms that have been developed and commercialized or are realizable depending on future technological developments.

Although not shown in FIG. 1, the thin layer deposition apparatus 1 according to the current embodiment may further include an alignment unit which aligns the mask unit 20 with the display substrate 100 and a driving unit which moves the substrate support 40 or the mask unit 20.

The alignment unit may include a camera unit which photographs an align mark formed on the bead mask support 20. In some cases, the alignment unit may further include a displacement sensor which senses displacement relative to the mask unit 20. Image information obtained by the camera unit and displacement information obtained by the displacement sensor may be used to control the driving unit. The driving unit may align the mask unit 20 and the display substrate 100 with each other by moving the substrate support 40 or the mask unit 20.

Figure 2:
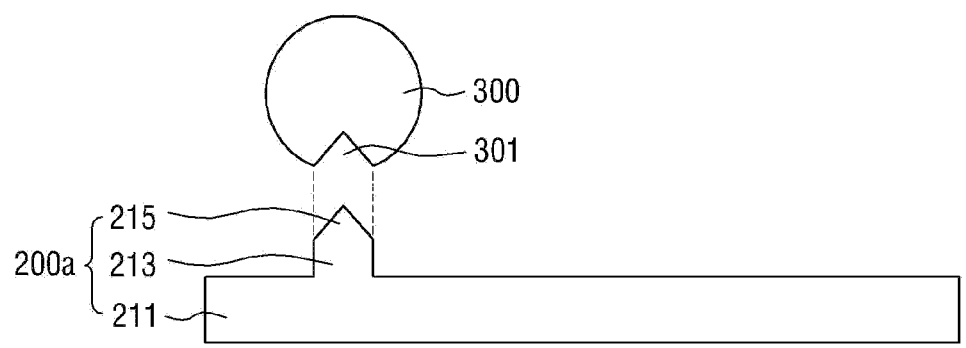
FIGS. 2 through 4 are cross-sectional views illustrating the schematic structures of embodiments of a bead mask support of a mask unit shown in FIG. 1.
Figure 3:
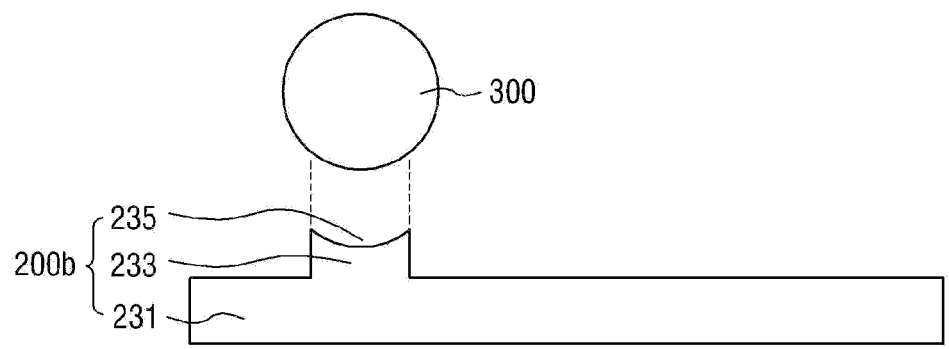
Figure 4:
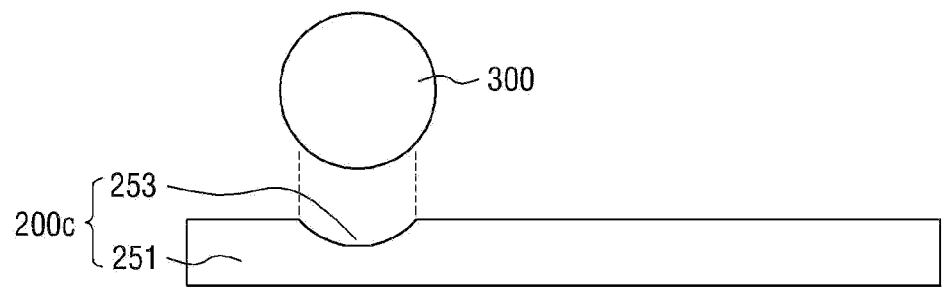

FIGS. 2 through 4 are views illustrating the schematic configurations of embodiments of the bead mask support 200 of the mask unit 20 shown in FIG. 1.

Referring to FIG. 2, a bead mask support 200a according to an embodiment of the present invention may include a plate 211 which forms the body of the bead mask support 200a and a protrusion 213 which may be formed on the plate 211.

The protrusion 213 may be inserted into a fixing groove 301 formed in a bead mask 300, thereby fixing and supporting the bead mask 300.

To insert the protrusion 213 into the fixing groove 301 more easily, an upper portion 215 of the protrusion 213 may have a shape that becomes narrower from the bottom toward the top or may be fin-shaped. The fixing groove 301 of the bead mask 300 may have a shape corresponding to the shape of the upper portion 215 of the protrusion 213 of the bead mask 300.

That is, the upper portion 215 of the protrusion 213 may be fin-shaped, and the fixing groove 301 of a shape corresponding to the shape of the upper portion 215 may be formed in the bead mask 300. Therefore, the bead mask 300 may be fixed to the bead mask support 200a by inserting the upper portion 215 of the protrusion 213 into the fixing groove 301.

Referring to FIG. 3, a bead mask support 200b according to another embodiment of the present invention may include a plate 231 which forms the body of the bead mask support 200b and a protrusion 233 which may be formed on the plate 231.

A concave groove 235 may be formed in an upper portion of the protrusion 233, such that a bead mask 300 can be mounted in the concave groove 235. That is, unlike in FIG. 2, in FIG. 3, a bead mask 300 may not have a fixing groove (indicated by reference numeral 301 in FIG. 2). Instead, the concave groove 235 corresponding to a portion of the bead mask 300 may be formed in the upper portion of the protrusion 233, and the bead mask 300 may be mounted in the concave groove 235.

Referring to FIG. 4, a bead mask support 200c according to another embodiment of the present invention may include a plate 251 which forms the body of the bead mask support 200c, and a concave groove 255 may be formed in a surface of the plate 251 such that a bead mask 300 can be mounted in the concave groove 255. That is, unlike in FIG. 3, in FIG. 4, the bead mask support 200c may not have a protrusion (indicated by reference numeral 233 in FIG. 3). In addition, unlike in FIG. 2, in FIG. 4, the bead mask 300 may not have a fixing groove (indicated by reference numeral 301 in FIG. 2). The concave groove 255 may have a shape corresponding to the shape of a portion of the bead mask 300, and the bead mask 300 may be fixed to the bead mask support 200c as it is mounted in the concave groove 255.

The structures of the bead mask support 200 described above with reference to FIGS. 2 through 4 are merely examples, and the bead mask support 200 can have various structures other than the above examples.

Figure 5:
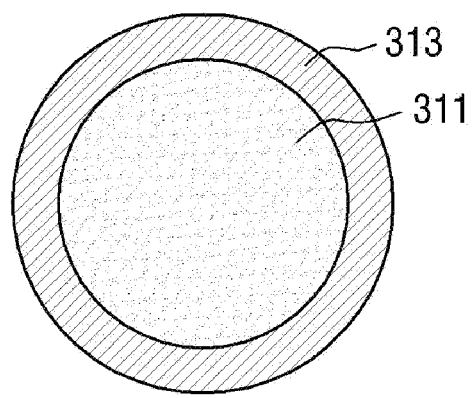
FIGS. 5 through 7 are cross-sectional views illustrating the schematic structures of embodiments of a bead mask of the mask unit shown in FIG. 1.

FIG. 5 is a view illustrating the schematic structure of a bead mask 300a according to an embodiment of the present invention.

Referring to FIG. 5, the bead mask 300a may include a core portion 311 formed of polymer and a magnetic layer 313 formed on an outer circumferential surface of the core portion 311.

The polymer material that forms the core portion 311 is not limited. Examples of the polymer material may include, but not limited to, polystyrene resin, polymethyl methacrylate (PMMA) resin, polycarbonate resin, epoxy resin, etc.

The magnetic layer 313 may cover the outer circumferential surface of the core unit 311, that is, may be shell-shaped.

The magnetic layer 313 may be formed of, but not limited to, a substance with magnetic properties, that is, a magnetic substance that may be magnetized in a magnetic field. In an exemplary embodiment, the magnetic substance may be a paramagnetic substance which may be magnetized in a magnetic field and is not magnetized if the magnetic field is removed. Alternatively, the magnetic substance may be a ferromagnetic substance which is magnetized in an external magnetic field in the direction of the magnetic field and remains partially magnetized even after the magnetic field is removed.

Figure 6:
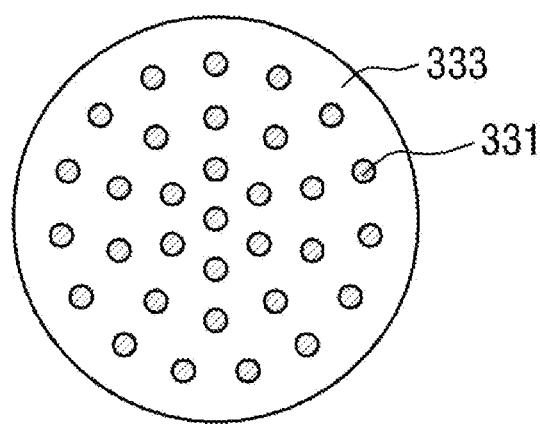

FIG. 6 is a view illustrating the schematic structure of a bead mask 300b according to another embodiment of the present invention.

Referring to FIG. 6, the bead mask 300b may consist of a mixture of a polymer 333 and magnetic particles 331

The polymer material that forms the polymer 333 is not limited. As described above with reference to FIG. 5, examples of the polymer material may include, but not limited to, polystyrene resin, PMMA resin, polycarbonate resin, epoxy resin, etc.

The magnetic particles 331 may be, but are not limited to, a substance with magnetic properties, that is, a magnetic substance (such as a ferromagnetic substance or a paramagnetic substance) that may be magnetized in a magnetic field. The magnetic particles 331 may be uniformly mixed with each other within the polymer 333 and magnetized by an external magnetic field.

Although not shown in the drawings, a bead mask may also have a combination of the structure of FIG. 5 and the structure of FIG. 6. In an example, a bead mask may consist of a core portion (indicated by reference numeral 311 in FIG. 5) in which magnetic particles (indicated by reference numeral 331 in FIG. 6) are uniformly mixed and a magnetic layer (indicated by reference numeral 313 in FIG. 5) which surrounds the core portion (311 in FIG. 5).

Figure 7:
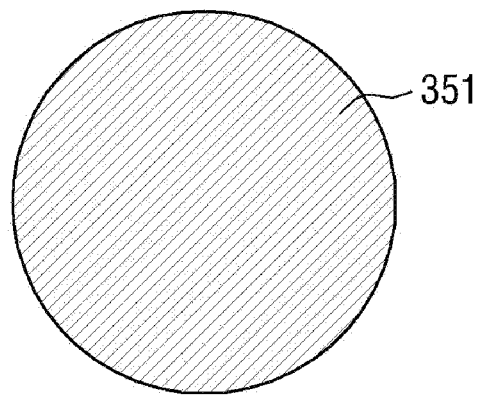

FIG. 7 is a view illustrating the schematic structure of a bead mask 300c according to another embodiment of the present invention.

Referring to FIG. 7, the bead mask 300c may consist of one core portion 351, unlike the structures of FIGS. 5 and 6.

The core portion 351 may be formed of, but not limited to, a magnetic substance such as a ferromagnetic substance or a paramagnetic substance, as described above with reference to FIGS. 5 and 6.

Figure 8:
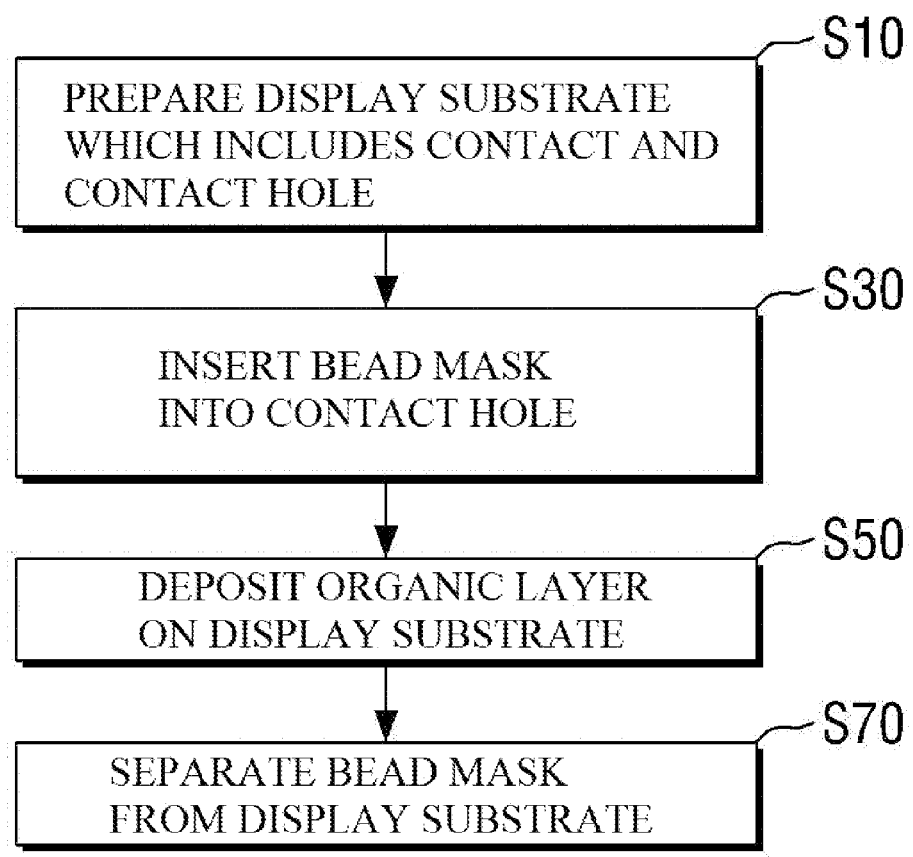
FIG. 8 is a flowchart illustrating a method of manufacturing a display device according to embodiments of the present invention.

FIG. 8 is a flowchart illustrating a method of manufacturing a display device according to embodiments of the present invention. FIGS. 9 through 12 are cross-sectional views schematically illustrating example steps of the method of FIG. 8.

Referring to FIG. 8, the method of manufacturing a display device according to the embodiments of the present invention may include preparing a display substrate which includes a contact hole in a surface thereof and a contact formed in the contact hole (operation S10), mounting a bead mask in the contact hole (operation S30), forming an organic layer by depositing an organic material on the display substrate (operation S50) and separating the bead mask from the display substrate (operation S70), and may further include forming a conductive layer on the display substrate such that the conductive layer may be electrically connected to the contact after the separating of the bead mask from the display substrate.

Each step of the method of manufacturing a display device will now be described in detail with reference to FIGS. 9 through 12 for a case where a bead mask includes a magnetic substance and a case where a bead mask may be formed of a permanent magnet. In addition, a case where a mask unit is structured as shown in FIG. 2 will be described below as an example. However, the present invention is not limited to this case.

In a case where a bead mask includes a magnetic substance, each step of the method of manufacturing a display device may be performed as follows.

Figure 9:
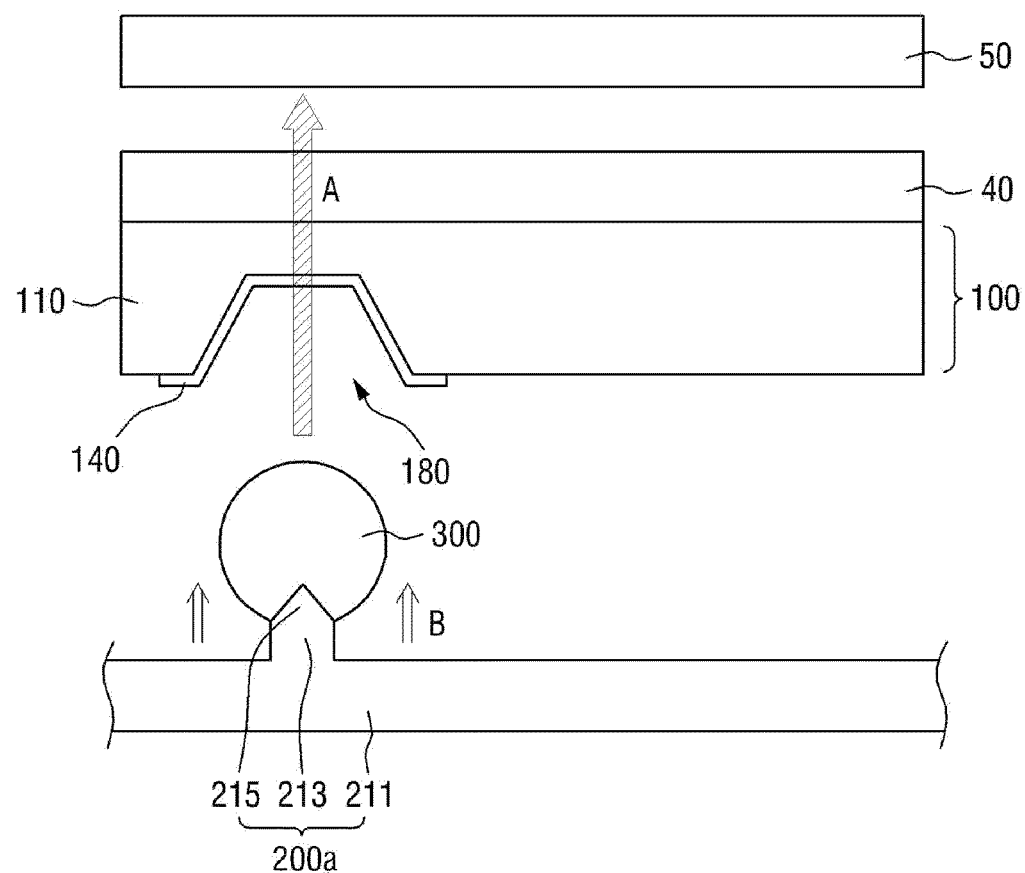
FIGS. 9 through 12 are cross-sectional views schematically illustrating example steps of the method of FIG. 8.

Referring to FIG. 9, a display substrate 100 including a contact hole 180 and a contact electrode 140 formed in the contact hole 180 may be prepared (operation S10 in FIG. 8) and may be fixed to a substrate support 40.

The display substrate 100 may include a substrate 110, the contact hole 180 formed in the substrate 110, and the contact electrode 140 formed in the contact hole 180.

The substrate 110 may include an insulating substrate. The insulating substrate may be formed of a transparent glass material containing transparent $SiO_2$ as its main component. In some embodiments, the insulating substrate may be formed of an opaque material or a plastic material. Further, the insulating substrate may be a flexible substrate. Although not shown in the drawing, the substrate may further include other structures formed on the insulating substrate. Examples of other structures may include, but are not limited to, wiring lines, electrodes, insulating layers, etc.

The contact electrode 140 may be formed in the contact hole 180 in the substrate 110. A side of the contact electrode 140 may be electrically connected to an auxiliary electrode wiring line (not shown) for preventing a voltage drop, and the other side of the contact electrode 140 may be exposed outside of the contact hole 180. The material that forms the contact electrode 140 is not limited and may be, but is not limited to, Ag, Mg, Al, Pt, Pd, Au, Ni, Nd, Ir, Cr, Li, Ca, LiF/Ca or LiF/Al.

The substrate support 40 may include a substrate fixing unit. The substrate fixing unit fixes the display substrate 100 to the substrate support 40, thus inhibiting the shaking or movement of the display substrate 100 during a process.

Then, the display substrate 100 and a mask unit (200a, 300) may be aligned with each other. More specifically, the contact hole 180 of the display substrate 100 and a bead mask 300 may be aligned with each other.

The alignment process may be executed by the alignment unit and the driving unit described above with reference to FIG. 1. In an example, alignment mark image information of a bead mask support 200a photographed by the camera unit of the alignment unit and displacement information of the mask unit (200a, 300) obtained by the displacement sensor of the alignment unit may be used to control the driving unit, and the driving unit may align the mask unit (200a, 300) with the display substrate 100 by moving the substrate support 40 or the mask unit (200a, 300). However, this is merely an example, and the contact hole 180 of the display substrate 100 can be aligned with the bead mask 300 in various ways using all technologies that have been developed and commercialized or are realizable depending on future technological developments.

The bead mask 300 is mounted in the contact hole 180 of the display substrate 100. In an example, a magnetic force may be generated by supplying a current to a magnetic force applying unit 50 including an electromagnet. Since the bead mask 300 includes a magnetic substance, it receives an attractive force A from the magnetic force applying unit 50 including the electromagnet. The attractive force A causes the bead mask 300 to be easily separated from the bead mask support 200 and then be mounted in the contact hole 180.

If the bead mask support 200a includes an electromagnet, a current may have already been supplied to the bead mask support 200a in the alignment process. Thus, a magnetic force may have already been generated in the bead mask support 200a. That is, to prevent the movement of the bead mask 300 during the process of moving the mask unit (200a, 300) and the above alignment process, the bead mask support 200a may have been magnetized by a current applied thereto. Accordingly, an attractive force may have already been generated between the bead mask support 200a and the bead mask 300.

In this case, the attractive force between the bead mask 300 and the bead mask support 200a may be removed by reducing or removing the current supplied to the bead mask support 200a in the process of mounting the bead mask 300 in the contact hole 180 of the display substrate 100. This is to allow the bead mask 300 to be mounted in the contact hole 180 more easily by the attractive force A between the bead mask 300 and the magnetic force applying unit 50.

Figure 10:
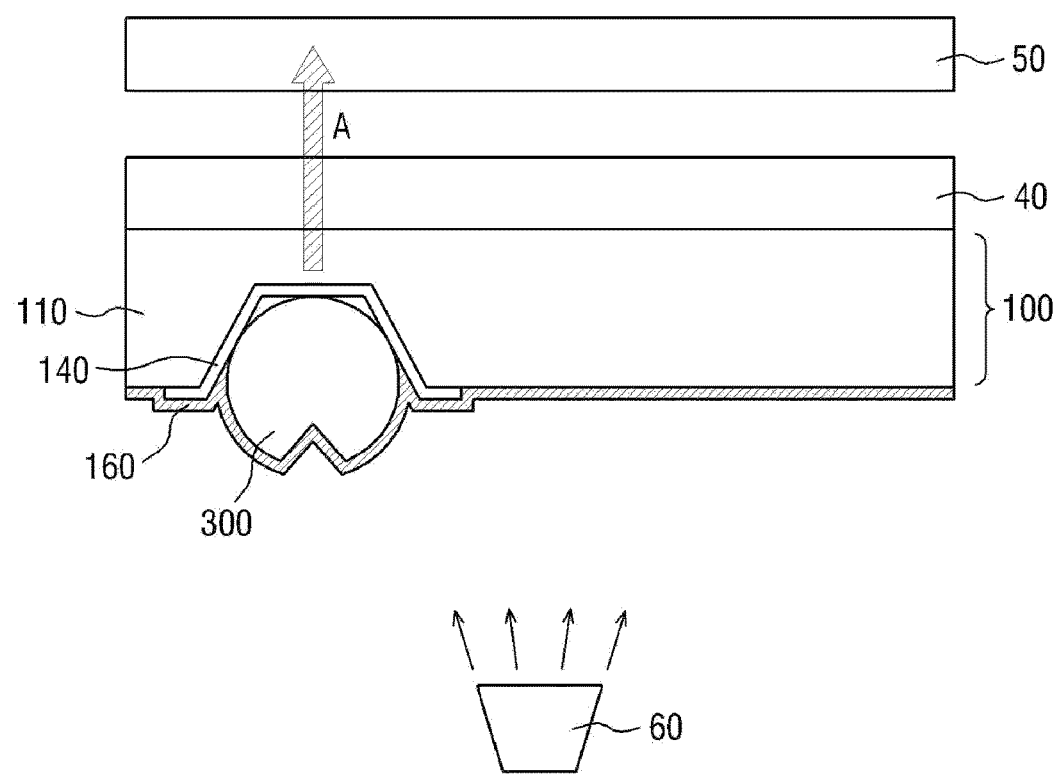

Next, the bead mask support 200a may be moved, and an organic layer 160 may be formed by depositing an organic material on the display substrate 100 as shown in FIG. 10 (operation S30 in FIG. 8).

During the deposition process, a magnetic (attractive) force may continuously be transmitted to the bead mask 300 by supplying a current to the magnetic force applying unit 50. Accordingly, during the deposition process, the separation of the bead mask 300 from the display substrate 100 can be prevented, and the bead mask 300 can be kept attached firmly to the display substrate 100. Accordingly, the formation of the organic layer 160 in the contact hole 180 can be prevented more effectively.

The organic layer 160 may be a common layer in an organic light-emitting diode (OLED) display. In an example, the organic layer 160 may include at least one of a hole injection layer, a hole transport layer, an electron transport layer, and an electron injection layer.

A method of forming the organic layer 160 is not limited. In an example, the organic layer 160 may be formed by depositing a deposition material provided from a source unit 60 on the display substrate 100. Otherwise, the organic layer 160 may be formed by plasma enhanced chemical vapor deposition (PECVD), atmospheric pressure CVD, low pressure CVD, inkjet printing, spin coating, or thermal printing using a laser. However, these are merely examples, and the organic layer 160 can be deposited using all methods that have been developed and commercialized or are realizable depending on future technological developments.

Since the organic layer 160 may be formed by depositing an organic material after the bead mask 300 may be mounted in the contact hole 180 of the display substrate 100, the organic material may not be deposited on the contact electrode 140 or may be deposited on only part of a side surface of the contact electrode 140. Therefore, there is no need to perform a process of removing the organic material from the contact electrode 140 using, e.g., a laser. In addition, since the laser is not used, the possible damage to the organic layer 160 in the process of removing the organic material can be prevented. Additionally, manufacturing costs can be saved since expensive laser equipment is not used.

Figure 11:
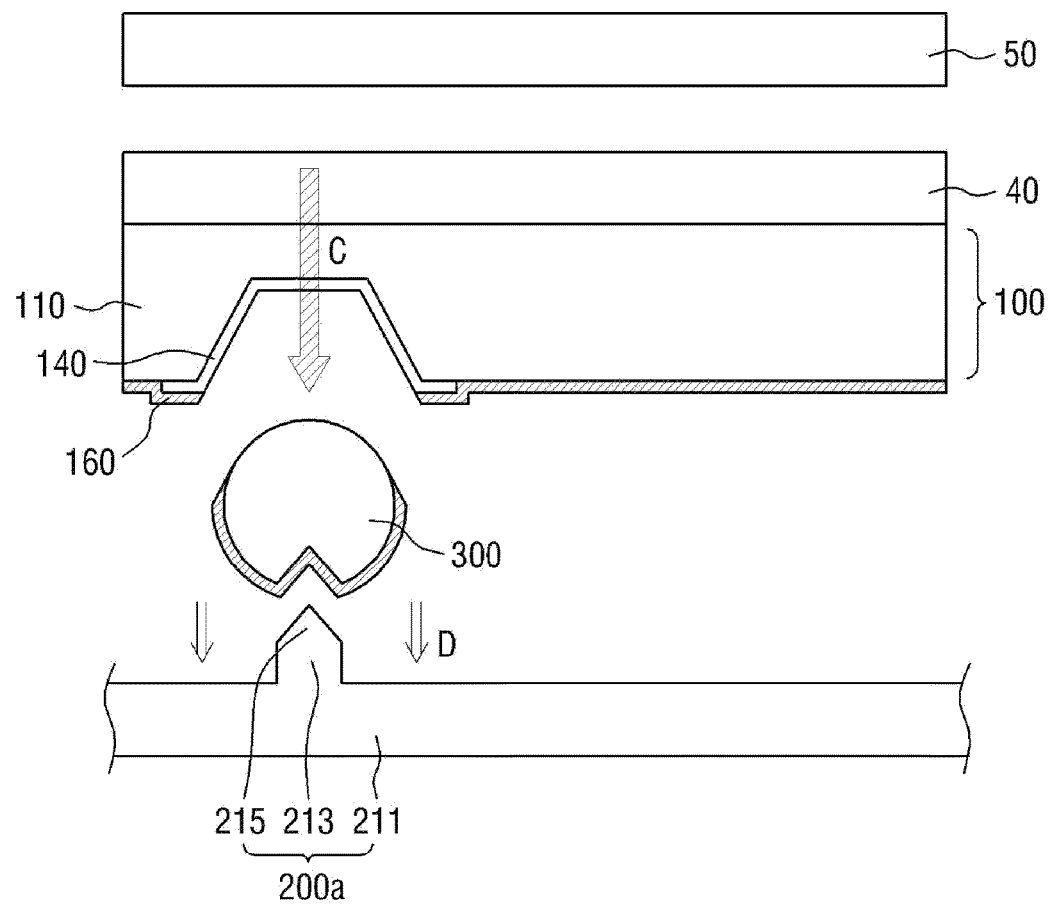

Referring to FIG. 11, the bead mask 300 may be separated from the display substrate 100 (operation S70 in FIG. 8).

Specifically, the bead mask support 200a and the bead mask 300 are aligned with each other. The bead mask 300 can be separated more easily from the display substrate 100 by reducing or removing the attractive force A between the bead mask 300 and the magnetic force applying unit 50 by reducing or removing the current supplied to the magnetic force applying unit 50.

Figure 12:
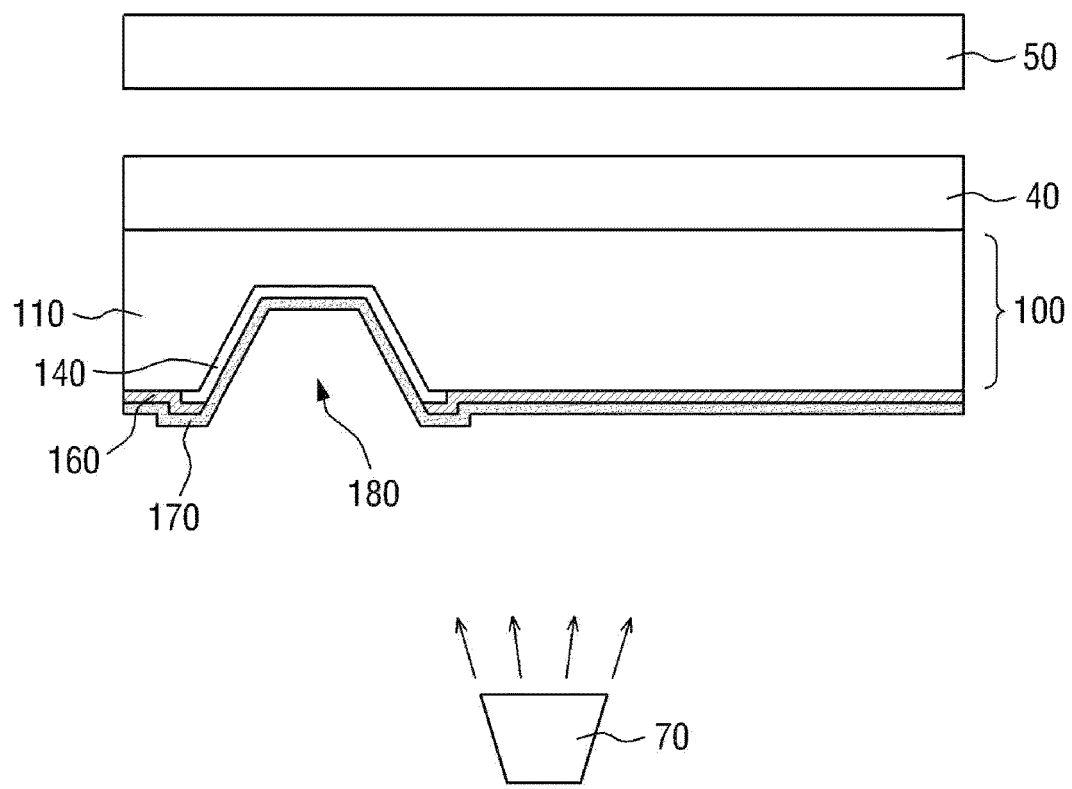

Referring to FIG. 12, a conductive layer 170 may be formed on the display substrate 100. Here, since the organic layer 160 is not formed on the contact electrode 140 within the contact hole 180, a display device in which the contact electrode 140 and the conductive layer 170 are electrically connected to each other without an additional process can be obtained.

The conductive layer 170 may be a common electrode of a display device, and a method of forming the conductive layer 170 is not limited. For example, sputtering, E-beam deposition, thermal deposition, etc may be used. However, the method of forming the conductive layer 170 is not limited to the above examples, and the conductive layer 170 can be formed using all technologies that have been developed and commercialized or are realizable depending on future technological developments.

In the above-described method of manufacturing a display device according to the present invention, the organic layer 160 is not formed on the contact electrode 140 within the contact hole 180. Therefore, an additional process of removing the organic layer 160 using a laser in order to connect the conductive layer 170 to the contact electrode 140 is not required, thus improving process efficiency. In addition, since the process of partially removing the organic layer 160 is not necessary, the damage to the organic layer 160 can be prevented. Additionally, manufacturing costs can be saved since expensive laser equipment is not used.

In the case where a bead mask may be formed of a permanent magnet having N and S poles, each step of the method of manufacturing a display device may be performed as follows.

Referring to FIG. 9, a display substrate 100 including a contact hole 180 and a contact electrode 140 formed in the contact hole 180 may be prepared (operation S10 in FIG. 8) and may be fixed to a substrate support 40.

Then, the display substrate 100 and a mask unit (200a, 300) may be aligned with each other. More specifically, the contact hole 180 of the display substrate 100 and a bead mask 300 may be aligned with each other.

The bead mask 300 may be mounted in the contact hole 180 of the display substrate 100. In an example, a magnetic force may be generated by supplying a current to a magnetic force applying unit 50 including an electromagnet. Here, if a portion of the bead mask 300 which faces the display substrate 100 has an N pole, a surface of the magnetic force applying unit 50 which faces the display substrate 100 may be electromagnetically induced to have an S pole. Accordingly, an attractive force A may be generated between the S pole of the magnetic force applying unit 50 and the N pole of the bead mask 300. The attractive force A causes the bead mask 300 to be separated more easily from a bead mask support 200a and then be mounted in the contact hole 180.

If the bead mask support 200a includes an electromagnet, a magnetic force may also be generated in the bead mask support 200a. In an example, if the portion of the bead mask 300 which faces the display substrate 100 has the N pole, a portion of the bead mask 300 which faces the bead mask support 200a has the S pole. Here, a surface of the bead mask support 200a which faces the bead mask 300 may be electromagnetically induced to have the S pole by supplying a current to the bead mask support 200a.

Accordingly, a repulsive force B may be generated between the S pole of the bead mask support 200a and the S pole of the bead mask 300. The repulsive force B causes the bead mask 300 to be separated more easily from the bead mask support 200 and then be mounted in the contact hole 180.

The above-described electromagnetic induction can be performed on any one or both of the magnetic force applying unit 50 and the bead mask support 200a.

Next, the bead mask support 200a may be moved, and an organic layer 160 may be formed by depositing an organic material on the display substrate 100 as shown in FIG. 10 (operation S30 in FIG. 8).

During the deposition process, a magnetic (attractive) force may continuously be transmitted to the bead mask 300 by supplying a current to the magnetic force applying unit 50. Accordingly, during the deposition process, the separation of the bead mask 300 from the display substrate 100 can be prevented, and the bead mask 300 can be kept attached firmly to the display substrate 100. Accordingly, the formation of the organic layer 160 in the contact hole 180 and on the contact electrode 140 can be prevented more effectively.

The organic layer 160 is identical to the organic layer 160 in the case where a bead mask includes a magnetic substance, and thus a detailed description thereof will be omitted.

Referring to FIG. 11, the bead mask 300 may be separated from the display substrate 100 (operation S70 in FIG. 8).

Specifically, the bead mask support 200a and the bead mask 300 are aligned with each other. The bead mask 300 can be separated from the display substrate 100 by reducing or removing the attractive force A between the bead mask 300 and the magnetic force applying unit 50 by reducing or removing the current supplied to the magnetic force applying unit 50.

Alternatively, if the portion of the bead mask 300 which faces the display substrate 100 has the N pole, the surface of the magnetic force applying unit 50 which faces the display substrate 100 may be electromagnetically induced to have the N pole. Accordingly, a repulsive force C may be generated between the magnetic force applying unit 50 and the bead mask 300. The repulsive force C causes the bead mask 300 to be separated more easily from the display substrate 100.

If the bead mask support 200a includes an electromagnet, a magnetic force may also be generated in the bead mask support 200a. In an example, if the portion of the bead mask 300 which faces the display substrate 100 has the N pole, the portion of the bead mask 300 which faces the bead mask support 200a has the S pole. Here, the surface of the bead mask support 200a which faces the bead mask 300 may be electromagnetically induced to have the N pole by supplying a current to the bead mask support 200a.

Accordingly, an attractive force D may be generated between the N pole of the bead mask support 200a and the S pole of the bead mask 300. The attractive force D causes the bead mask 300 to be separated more easily from the display substrate 100 and then be mounted on the bead mask support 200a.

The above-described electromagnetic induction can be performed on any one or both of the magnetic force applying unit 50 and the bead mask support 200a.

Referring to FIG. 12, a conductive layer 170 may be formed on the display substrate 100. Here, since the organic layer 160 is not formed on the contact electrode 140 within the contact hole 180, a display device in which the contact electrode 140 and the conductive layer 170 are electrically connected to each other without an additional process can be obtained.

In the above-described method of manufacturing a display device according to the present invention, the organic layer 160 is not formed on the contact electrode 140 within the contact hole 180. Therefore, an additional process of removing the organic layer 160 using a laser in order to connect the conductive layer 170 to the contact electrode 140 is not required, thus improving process efficiency. In addition, since the process of partially removing the organic layer 160 is not necessary, the damage to the organic layer 160 can be prevented. Additionally, manufacturing costs can be saved since expensive laser equipment is not used.

Figure 13:
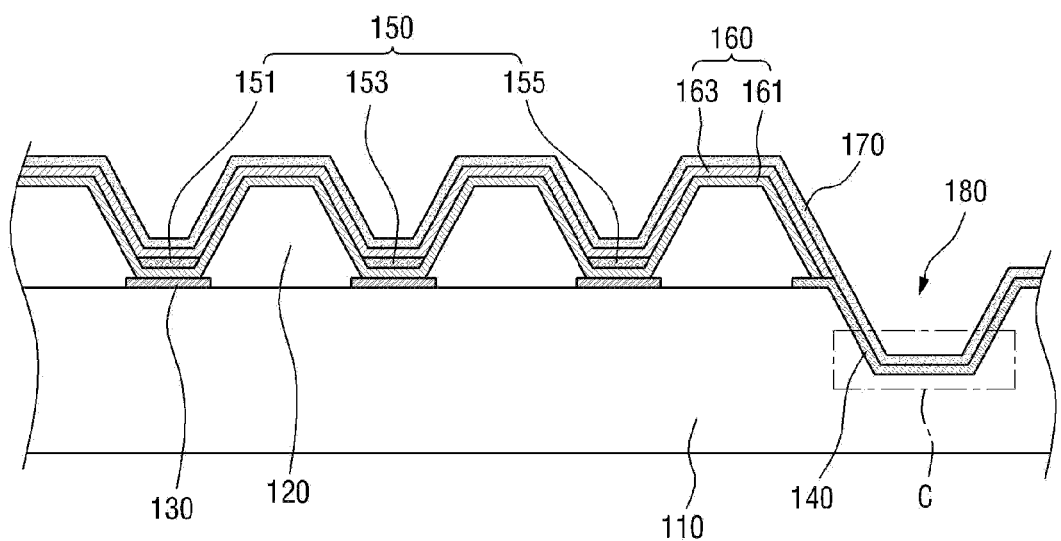
FIG. 13 is a cross-sectional view illustrating the schematic structure of a display device according to an embodiment of the present invention.
Figure 14:
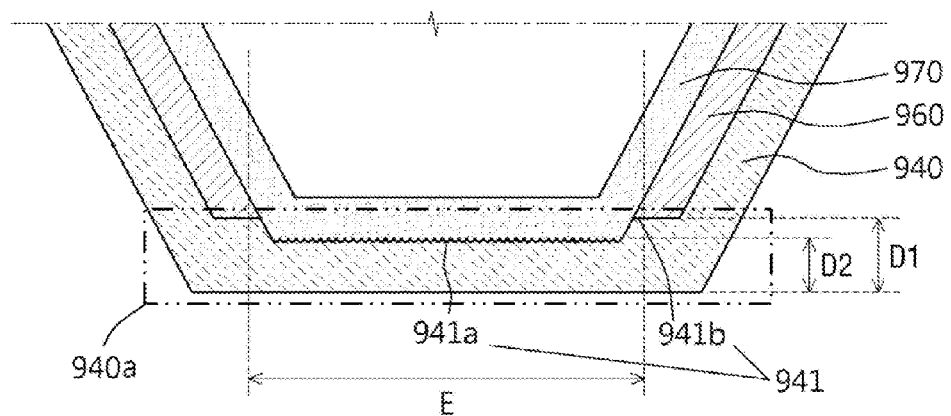
FIG. 14 is an enlarged cross-sectional view of a contact electrode portion of a conventional display device.
Figure 15:
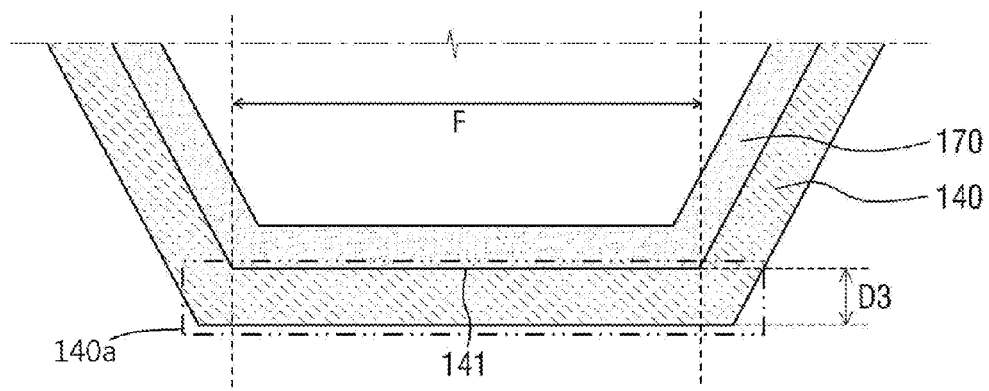
FIG. 15 is an enlarged cross-sectional view of a contact electrode portion of the display device shown in FIG. 13.

FIG. 13 is a cross-sectional view illustrating the schematic structure of a display device 10 according to an embodiment of the present invention. FIG. 14 is an enlarged cross-sectional view of a contact electrode portion of a conventional display device, and FIG. 15 is an enlarged cross-sectional view of a contact electrode portion of the display device 10 shown in FIG. 13.

Referring to FIG. 13, the display device 10 according to the present invention may be an OLED display which includes a substrate 110, a pixel defining layer 120, a first electrode 130, a contact electrode 140, a light-emitting layer 150, an organic layer 160, and a second electrode 170.

The substrate 110 on which the first electrode 130 may be formed may include an insulating substrate. The insulating substrate may be formed of a transparent glass material containing transparent $SiO_2$ as its main component. In some embodiments, the insulating substrate may be formed of an opaque material or a plastic material. Further, the insulating substrate may be a flexible substrate.

Although not shown in the drawing, the substrate 110 may further include other structures formed on the insulating substrate. Examples of other structures may include, but are not limited to, wiring lines, electrodes, insulating layers, etc. If the display device 10 according to the current embodiment may be an active matrix OLED display, the substrate 110 may include a plurality of thin-film transistors formed on the insulating substrate. A drain electrode of each of at least some of the thin-film transistors may be electrically connected to the first electrode 130.

The first electrode 130 may be an anode or cathode of an OLED. If the first electrode 130 may be an anode, the second electrode 170 may be a cathode. A case where the first electrode 130 may be an anode will hereinafter be described as an example. However, this is merely an example, and the first electrode 130 may also be a cathode, and the second electrode 170 may also be an anode.

The first electrode 130 used as an anode may be formed of a conductive material with a high work function. If the display device 10 is a bottom emission display device, the first electrode 120 may be formed of a material such as ITO, IZO, ZnO or $In_2O_3$, or a stack of these materials. If the display device 10 is a top emission display device, the first electrode 130 may be formed of a conductive material with a low work function. In an example, the first electrode 130 may include Ag, Mg, Al, Pt, Pd, Au, Ni, Nd, Ir, Cr, Li, Ca, LiF/Ca or LiF/Al, and may be a reflective electrode.

The contact electrode 140 may be formed in a contact hole 180 formed in the substrate 110. The contact hole 140 and the first electrode 130 may be formed simultaneously or separately. The material that forms the contact electrode 140 is not limited and may include, for example, Ag, Mg, Al, Pt, Pd, Au, Ni, Nd, Ir, Cr, Li, Ca, LiF/Ca, LiF/Al, etc. The contact electrode 140 and the first electrode 130 may be formed of the same material or different materials.

A side of the contact electrode 140 may be electrically connected to an auxiliary electrode wiring line (not shown) for preventing a voltage drop of the second electrode 170, and the other side of the contact electrode 140 may directly contact the second electrode 170.

The pixel defining layer 120 may be formed on the substrate 110 having the first electrode 130. The pixel defining layer 120 may be disposed at boundaries of a plurality of pixels to separate the pixels from each other. In addition, the pixel defining layer 120 may define apertures, each providing a space in which the light-emitting layer 150 may be disposed. The first electrode 130 may be exposed by each aperture of the pixel defining layer 120. However, sides of the first electrode 130 may extend toward the pixel defining layer 120 to partially overlap the pixel defining layer 120. In a region in which the pixel defining layer 120 and the first electrode 130 overlap each other, the pixel defining layer 120 may be located on the first electrode 130 with respect to the substrate 110.

The pixel defining layer 120 may be formed of an insulating material. Specifically, the pixel defining layer 120 may be formed of at least one organic material selected from the group consisting of benzocyclobutene (BCB), polyimide (PI), polyamide (PA), acrylic resin and phenolic resin. However, this is merely an example, and the pixel defining layer 120 may also be formed of an inorganic material such as $SiO_2$, SiNx, $Al_2O_3$, CuOx, $Tb_4O_7$, $Y_2O_3$, $Nb_2O_5$, $Pr_2O_3$, etc.

A first organic layer 161 may be formed on the first electrode 130 exposed by each aperture of the pixel defining layer 120. The first organic layer 161 may help the injection or transportation of electrons or holes between the first electrode 130 and the second electrode 170. If the first electrode 130 may be an anode, the first organic layer 161 may be a layer related to the injection or transportation of holes. In an example, the first organic layer 161 may include either a hole injection layer or a hole transport layer or may include a stack of the hole injection layer and the hole transport layer.

The hole injection layer may be formed of a phthalocyanine compound, such as copper phthalocyanine, or a starburst amine such as TCTA, m-MTDATA or m-MTDAPB.

The hole transport layer may be formed of N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), etc.

The first organic layer 161 may extend onto a fop surface of the pixel defining layer 120. The first organic layer 161 may be divided into a plurality of sections corresponding respectively to the pixels. Alternatively, the first organic layer 161 may be formed as a single piece over the entire display device 10, as shown in FIG. 13. That is, the first organic layer 140 may be formed as a common layer, regardless of the division between the pixels.

The first organic layer 161 formed as a common layer may have a uniform thickness over the entire display device 10.

The thickness uniformity of the first organic layer 161 may depend on a thickness of the pixel defining layer 120, in other words, a distance from a bottom surface of the pixel defining layer 120 to the top surface thereof. If the pixel defining layer 120 may be too thick, it is difficult to form the first organic layer 161 to have a uniform thickness. In view of this fact, the thickness of the pixel defining layer 120 may be adjusted, but not limited, to approximately 1 µm or less.

To form the first organic layer 161 as a common layer, any one of the bead masks described above with reference to FIGS. 1 through 12 may be mounted in the contact hole 180, and then a deposition material that forms the first organic layer 161 may be deposited on the entire display device 10. That is, since the first organic layer 161 may be formed in a state where a bead mask may be placed in the contact hole 180, it is not deposited on the contact hole 180 and the contact electrode 140.

The light-emitting layer 150 may be disposed on the first organic layer 161. The light-emitting layer 150 may be disposed in each aperture of the pixel defining layer 120 to overlap the first electrode 130.

A top surface of the light-emitting layer 150 may be lower than the top surface of the pixel defining layer 120. That is, the top surface of the pixel defining layer 120 may protrude further upward than the light-emitting layer 150.

The light-emitting layer 150 may include at least one of a red light-emitting layer 151, a green light-emitting layer 153, and a blue light-emitting layer 155. The light-emitting layer 150 may be formed of a polymer or small molecule organic material which uniquely emits light of any one of red, green and blue or a polymer/small molecule compound.

In some embodiments, the light-emitting layer 150 may include a host material and a dopant material. Examples of the host material may include tris(8-hydroxy-quinolinato) aluminum (Alq3), 9,10-di(naphth-2-yl)anthracene (AND), 3-tert-butyl-9,10-di(naphth-2-yl) anthracene (TBADN), 4,4'-bis 2,2-diphenyl-ethene-1-yl)-4,4'-dimethylphenyl (DPVBi), 4,4'-bis(2,2-diphenyl-ethene-1-yl)-4,4'-dimethyl-phenyl (p-DMDPVBi), tert (9,9-diarylfluorene)s (TDAF), 2-9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-di-phenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis 9-carbazolyl)-2,2'-dimethyl-biphenyl (CBDP), 4,4'-bis(car-bazol-9-yl)-9,9-dimethyl-fluorene (DMFL-CBP), 4,4'-bis (carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), and 9,9-bis(9-phenyl-9H-carbazol)fluorene (FL-2CBP).

Examples of the dopant material may include 4,4'-bis[4-(di-p-tolylamino)styryl]biphenyl (DPAVBi), 9,10-di(naph-2-tyl)anthracene (ADN), and 3-tert-butyl-9,10-di(naph-2-tyl)anthracene (TBADN).

A second organic layer 163 may be formed on the light-emitting layer 150. The second organic layer 163 may help the injection or transportation of electrons or holes between the first electrode 130 and the second electrode 170. If the second electrode 170 is a cathode, the second organic layer 163 may be a layer related to the injection or trans-portation of electrons. In an example, the second organic layer 163 may include either an electron injection layer or an electron transport layer or may include a stack of the electron injection layer and the electron transport layer.

The electron transport layer may be formed of, e.g., a quinoline derivative, in particular, a material such as tris(8-quinolinorate)aluminum (Alq3), 3-(4-biphenylyl)-4-phenyl-5-(4-tert-butyl phenyl)-1,2,4-triazole (TAX), etc.

The electron injection layer may be formed of a material such as LiF, NaCl, CsF, $Li_2O$, BaO, Liq, etc.

The second organic layer 163 may extend onto the side and top surfaces of the pixel defining layer 120. The second organic layer 163 may be divided into a plurality of sections corresponding respectively to the pixels. Alternatively, the second organic layer 163 may be formed as a single piece over the entire display device 10, as shown in FIG. 13. That is, the second organic layer 163 may be formed as a common layer, regardless of the division between the pixels. In some embodiments, the second organic layer 163 may be omitted.

To form the second organic layer 163 as a common layer, any one of the bead masks described above with reference to FIGS. 1 through 12 may be mounted in the contact hole 180, and then a deposition material that forms the second organic layer 163 may be deposited on the entire display device 10. That is, since the second organic layer 163 may be formed in a state where a bead mask may be placed in the contact hole 180, it is not deposited on the contact hole 180 and the contact electrode 140.

The second electrode 170 may be formed on the second organic layer 163 and the contact electrode 140. The second electrode 170 may be deposited on the whole surface of the display device 10 to form a common electrode. The second electrode 170 may be used as a cathode. If the display device 10 is a top emission display device which realizes an image toward the second electrode 170, the second electrode 170 may be a transparent electrode. The second electrode 170 formed as a transparent electrode may include, but not limited to, one or more of ITO, IZO, ZnO, and $In_2O_3$. In an example, the second electrode 170 may have a two-layered structure by forming a semi-transparent metal layer by thinly depositing a metal material with a low work function and then depositing a transparent conductive material, such as ITO or IZO, on the semi-transparent metal layer. The conductive material with a low work function may include, but not limited to, Ag, Mg, Al, Pt, Pd, Au, Ni, Nd, Ir, Cr, Li, Ca, LiF/Ca, LiF/Al, etc.

In particular, according to the present invention, the first organic layer 161 or the second organic layer 163 may be formed after any one of the bead masks described above with reference to FIGS. 1 through 12 may be mounted in the contact hole 180. Therefore, there is no need to remove the first or second organic layer 161 or 163 in the contact hole 180 before the formation of the second electrode 170. In this regard, the display device 10 according to the current embodiment is different in structure from a conventional display device in which the organic layer 160 may be removed using, e.g., a laser.

FIG. 14 is an enlarged cross-sectional view of a contact electrode portion of a conventional display device, more specifically, an enlarged cross-sectional view of a contact electrode portion of a conventional display device in which an organic layer has been removed using a laser. FIG. 15 is an enlarged cross-sectional view of a contact electrode portion C of the display device 10 shown in FIG. 13.

Referring to FIG. 14, in the conventional display device, an organic layer 960 may be deposited on a contact electrode 940 as a common layer. Therefore, the organic layer 960 on the contact electrode 940 may be removed by laser process-ing, and a common electrode 970 may be deposited. Accord-ingly, the contact electrode 940 and the common electrode 970 are electrically connected to each other.

A top surface of the contact electrode 940 may be partially etched in the process of removing the organic layer 960 on the contact electrode 940. Therefore, a thickness D2 of a portion E of a horizontal component 940*a* of the contact electrode 940 which contacts the common electrode 970 may be different from a thickness D1 of the other portion of the horizontal component 940*a*. More specifically, of the horizontal component 940*a* of the contact electrode 940, the portion E which contacts the common electrode 970 may be divided into a middle portion and end portions. In this case, the thickness D2 of the middle portion may be smaller than the thickness D1 of the end portions. The end portions denote boundaries of the portion E of the horizontal component 940*a* of the contact electrode 940 which contacts the common electrode 970 and the organic layer 960.

In addition, surface roughness 941 of the portion E of the horizontal component 940*a* of the contact electrode 940 which contacts the common electrode 970 may not be uniform. More specifically, if the portion E of the horizontal component 940*a* of the contact electrode 940 which contacts the common electrode 970 may be divided into the middle portion and the end portions, surface roughness 941*a* of the middle portion may be different from surface roughness 941*b* of the end portions.

On the other hand, referring to FIG. 15, in the display device 10 according to the embodiment of FIG. 13, the organic layer 160 may be formed in a state where a bead mask may be placed on the contact electrode 140. Therefore, the organic layer 160 is not deposited on the contact electrode 140. In this regard, unlike the conventional display device, the display device 10 can be manufactured without the process of removing the organic layer 160 on the contact electrode 140 using a laser.

Accordingly, in the display device 10 according to the embodiment of FIG. 13, a portion F of a horizontal component 140*a* of the contact electrode 140 which contacts the second electrode 170 (which may be a common electrode) may have a substantially uniform thickness. More specifically, if the portion F of the horizontal component 140*a* of the contact electrode 140 which contacts the second electrode 170 may be divided into a middle portion and end portions, a thickness of the middle portion and a thickness of the end portions may have substantially the same value D3.

In addition, unlike in the conventional display device of FIG. 14, in the display device 10 according to the embodiment of FIG. 13, surface roughness 141 of the portion F of the horizontal component 140*a* of the contact electrode 140 which contacts the second electrode 170 may be substantially uniform. More specifically, if the portion F of the horizontal component 140*a* of the contact electrode 140 which contacts the second electrode 170 may be divided into the middle portion and the end portions, surface roughness 141*a* of the middle portion and surface roughness 141*b* of the end portions may have substantially the same value.

Embodiments of the present invention provide at least one of the following advantages.

That is, since a process of etching an organic layer using a laser may be omitted, a process of manufacturing a display device can be simplified.

In addition, since expensive equipment such as laser equipment is not used, display device manufacturing costs can be saved.

Further, a mask can be mounted on and separated from a substrate by adjusting a magnetic force. Therefore, the mask mounting and separation processes can be performed more easily.

Also, it is possible to provide a display device which can be manufactured with improved process efficiency and can prevent a voltage drop.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A mask unit for depositing a thin layer in a display device, the mask unit comprising:
    a deposition mask support which comprises a plate; and
    a deposition mask having a bead shape placed on the deposition mask support and capable of being separably contacting a contact hole in the display device,
    wherein the deposition mask comprises a core portion formed of a polymer material and a magnetic layer formed on an outer circumferential surface of the core portion.

2. The mask unit of claim 1, wherein the deposition mask comprises a permanent magnet.

3. The mask unit of claim 1, wherein the deposition mask comprises a magnetic substance.

4. The mask unit of claim 1, wherein the deposition mask support comprises an electromagnet.

5. The mask unit of claim 1, wherein the deposition mask support further comprises a protrusion formed on the plate.

6. The mask unit of claim 5, wherein the deposition mask further comprises a fixing groove into which the protrusion is inserted.

7. The mask unit of claim 5, wherein the deposition mask support comprises a concave groove formed in the protrusion, and the deposition mask is mounted in the concave groove.

8. The mask unit of claim 1, wherein the deposition mask support comprises a concave groove formed in the plate, and the deposition mask is mounted in the concave groove.

9. The mask unit of claim 1, wherein at least one of the deposition mask support and the magnetic layer comprises an electromagnet.

10. The mask unit of claim 1, wherein the deposition mask comprises a permanent magnet.

11. The mask unit of claim 5, wherein at least one of the magnetic layer and the deposition mask support comprises an electromagnet.

* * * * *